(12) United States Patent
Nahar et al.

(10) Patent No.: US 11,695,071 B2
(45) Date of Patent: Jul. 4, 2023

(54) TRANSISTOR AND METHODS OF FORMING TRANSISTORS

(71) Applicant: Micron Technology, Inc., Boise, ID (US)

(72) Inventors: Manuj Nahar, Boise, ID (US); Michael Mutch, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 160 days.

(21) Appl. No.: 17/159,594

(22) Filed: Jan. 27, 2021

(65) Prior Publication Data
US 2021/0175357 A1  Jun. 10, 2021

Related U.S. Application Data

(62) Division of application No. 16/536,544, filed on Aug. 9, 2019, now Pat. No. 10,964,811.

(51) Int. Cl.
H01L 29/78 (2006.01)
H01L 29/08 (2006.01)
(Continued)

(52) U.S. Cl.
CPC .... H01L 29/7827 (2013.01); H01L 21/02532 (2013.01); H01L 21/02592 (2013.01);
(Continued)

(58) Field of Classification Search
CPC ........... H01L 29/7827; H01L 21/02532; H01L 29/04; H01L 29/0847; H01L 21/02675;
(Continued)

(56) References Cited

U.S. PATENT DOCUMENTS 6,903,372 B1 * 6/2005 Yamaguchi ....... H01L 29/66765
257/E21.414
8,034,671 B2 10/2011 Peng et al.
(Continued)

FOREIGN PATENT DOCUMENTS

EP 0901169 3/1999
KR 10-2012-0037952 4/2012
(Continued)

*Primary Examiner* — Victor A Mandala
(74) *Attorney, Agent, or Firm* — Wells St. John P.S.

(57) ABSTRACT

A transistor comprises a top source/drain region, a bottom source/drain region, and a channel region vertically between the top and bottom source/drain regions. A gate is operatively laterally-adjacent the channel region. The top source/drain region, the bottom source/drain region, and the channel region respectively have crystal grains and grain boundaries between immediately-adjacent of the crystal grains. At least one of the bottom source/drain region and the channel region has an internal interface there-within between the crystal grains that are above the internal interface and the crystal grains that are below the internal interface. At least some of the crystal grains that are immediately-above the internal interface physically contact at least some of the crystal grains that are immediately-below the internal interface. All of the grain boundaries that are between immediately-adjacent of the physically-contacting crystal grains that are immediately-above and that are immediately-below the interface align relative one another. The internal interface comprises at least one of (a) and (b), where (a): conductivity-modifying dopant concentration immediately-above the internal interface is lower than immediately-below the internal interface and (b): a laterally-discontinuous insulative oxide. Other embodiments, including method, are disclosed.

26 Claims, 18 Drawing Sheets

(51) Int. Cl.
*H01L 29/10* (2006.01)
*H01L 29/36* (2006.01)
*H01L 21/02* (2006.01)
*H01L 29/04* (2006.01)
*H01L 29/66* (2006.01)
*H01L 29/06* (2006.01)

(52) U.S. Cl.
CPC ........ *H01L 21/02675* (2013.01); *H01L 29/04* (2013.01); *H01L 29/0684* (2013.01); *H01L 29/0847* (2013.01); *H01L 29/1037* (2013.01); *H01L 29/36* (2013.01); *H01L 29/66666* (2013.01)

(58) Field of Classification Search
CPC ................ H01L 29/1037; H01L 29/36; H01L 29/66666; H01L 29/0684; H01L 21/02592
See application file for complete search history.

(56) References Cited

U.S. PATENT DOCUMENTS

| | | | |
|---|---|---|---|
| 2001/0046755 A1 | 11/2001 | Hara et al. | |
| 2002/0052069 A1 | 5/2002 | Jiroku et al. | |
| 2003/0003766 A1* | 1/2003 | Kumomi ........... | H01L 21/02667 438/760 |
| 2003/0102508 A1 | 6/2003 | Lee | |
| 2003/0211666 A1 | 11/2003 | Okumura | |
| 2004/0152269 A1* | 8/2004 | Hergenrother ............................. | H01L 21/823487 257/E21.629 |
| 2005/0020096 A1 | 1/2005 | Miyairi et al. | |
| 2005/0255679 A1 | 11/2005 | Yamaguchi et al. | |
| 2006/0177361 A1 | 8/2006 | Kumomi | |
| 2009/0269892 A1 | 10/2009 | Hatano et al. | |
| 2009/0321737 A1 | 12/2009 | Isa et al. | |
| 2010/0044702 A1 | 2/2010 | Urayama et al. | |
| 2010/0163821 A1* | 7/2010 | Ohashi ................. | H01L 27/102 257/E29.327 |
| 2011/0017990 A1 | 1/2011 | Son et al. | |
| 2012/0100675 A1 | 4/2012 | Komatsu et al. | |
| 2012/0125432 A1 | 5/2012 | Matsui et al. | |
| 2012/0154346 A1* | 6/2012 | Hirose .............. | G02F 1/134309 345/204 |
| 2012/0217500 A1 | 8/2012 | Park et al. | |
| 2013/0056742 A1 | 3/2013 | Tezuka et al. | |
| 2013/0126869 A1 | 5/2013 | Kanegae et al. | |
| 2013/0143395 A1 | 6/2013 | Shieh et al. | |
| 2014/0141579 A1 | 5/2014 | Tian et al. | |
| 2014/0264353 A1* | 9/2014 | Lai ......... | H10B 41/27 438/266 |
| 2014/0374743 A1* | 12/2014 | Yamazaki ........... | H01L 21/0242 257/43 |
| 2015/0044833 A1 | 2/2015 | Lee et al. | |
| 2015/0084043 A1 | 3/2015 | Ishihara et al. | |
| 2015/0340631 A1 | 11/2015 | Rinzler et al. | |
| 2016/0035741 A1* | 2/2016 | Tajima ................. | H10B 43/35 257/324 |
| 2016/0099250 A1 | 4/2016 | Rabkin et al. | |
| 2017/0033175 A1 | 2/2017 | Oda et al. | |
| 2017/0062466 A1 | 3/2017 | Ishizaki | |
| 2017/0077125 A1 | 3/2017 | Yamasaki et al. | |
| 2017/0082902 A1 | 3/2017 | Hirose | |
| 2017/0235201 A1 | 8/2017 | Hirose | |
| 2019/0013388 A1* | 1/2019 | Han .................. | H01L 29/42372 |
| 2019/0067317 A1* | 2/2019 | Shioda .................. | H10B 41/27 |
| 2020/0066513 A1* | 2/2020 | Nahar .................... | H10B 12/05 |
| 2021/0043767 A1 | 2/2021 | Nahar et al. | |
| 2021/0043768 A1 | 2/2021 | Nahar et al. | |
| 2021/0043769 A1 | 2/2021 | Liu et al. | |

FOREIGN PATENT DOCUMENTS

| | | |
|---|---|---|
| KR | 10-2019-0006372 | 1/2019 |
| WO | WO 97/45827 | 12/1997 |
| WO | WO PCT/US2020/044509 | 11/2020 |
| WO | WO PCT/US2020/044509 | 2/2022 |

* cited by examiner

TRANSISTOR AND METHODS OF FORMING TRANSISTORS

RELATED PATENT DATA

This patent resulted from a divisional application of U.S. patent application Ser. No. 16/536,544, filed Aug. 9, 2019, entitled "Transistor And Methods Of Forming Transistors", naming Manuj Nahar and Michael Mutch as inventors, the disclosure of which is incorporated by reference.

TECHNICAL FIELD

Embodiments disclosed herein pertain to transistors and to methods of forming transistors

BACKGROUND

Memory is one type of integrated circuitry and is used in computer systems for storing data, Memory may be fabricated in one or more arrays of individual memory cells, Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate, Field effect transistors are of course also used in integrated circuitry other than and/or outside of memory circuitry.

DETAILED DESCRIPTION OF EXAMPLE EMBODIMENTS

Figure 1:
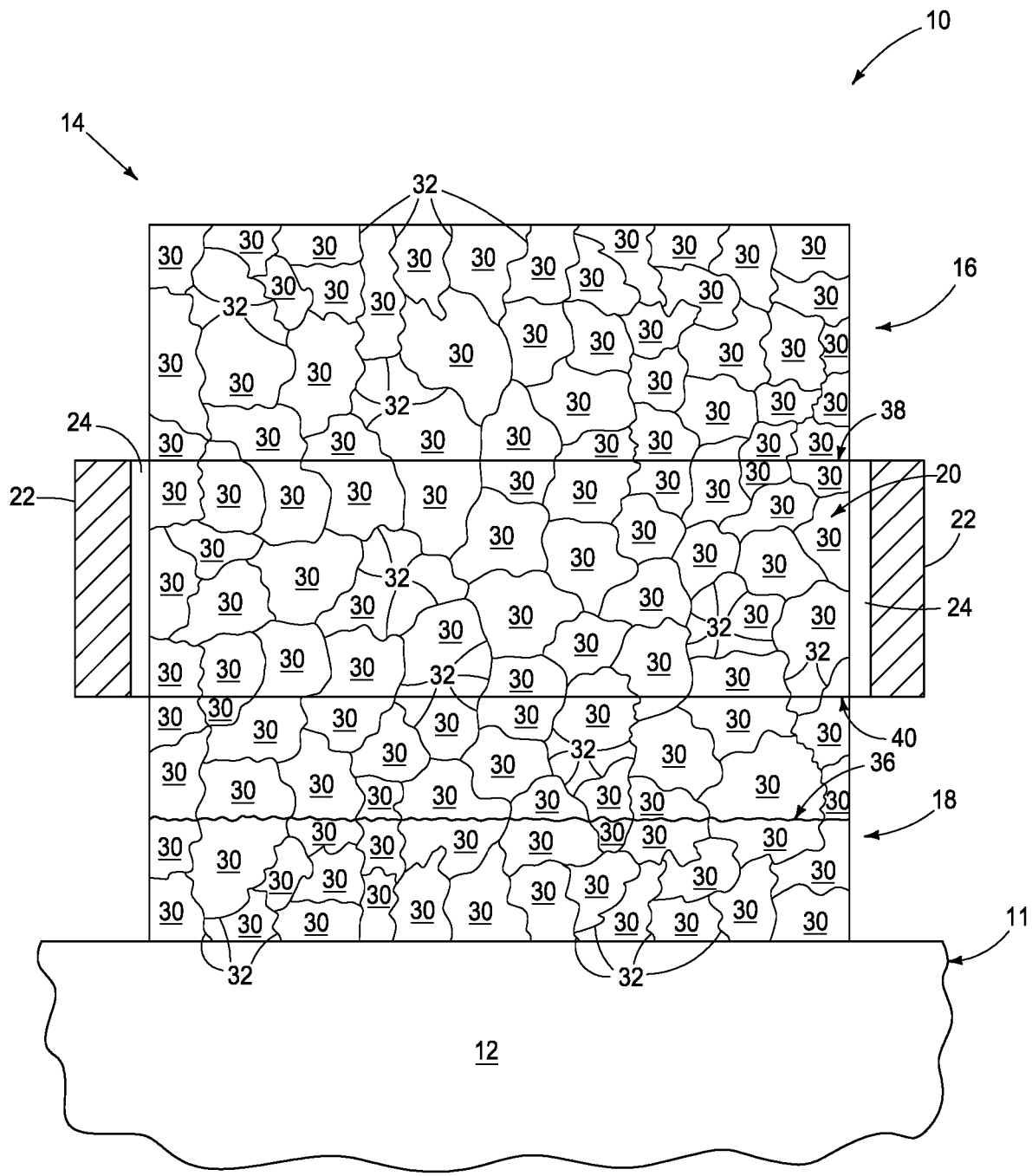
FIG. 1 is a diagrammatic sectional view of a transistor in accordance with an embodiment of the invention.

Embodiments of the invention encompass methods of forming one or more transistors and one or more transistors independent of method of manufacture. Transistors manufactured in accordance with method embodiments may have any of the attributes as described herein in structure embodiments. A first example transistor 14 in accordance with an embodiment of the invention as part of a construction 10 is shown in FIG. 1. Construction 10 comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Only one transistor 14 is shown, although construction 10 may comprise multiple of the same or different construction transistors, for example fabricated in an array which includes one or more transistors in accordance with the invention.

Transistor 14 comprises a top source/drain region 16, a bottom source/drain region 18, a channel region 20 vertically between top and bottom source/drain regions 16, 18, respectively, and a gate 22 (i.e., conductive material) operatively laterally-adjacent channel region 20. A gate insulator 24 (e.g., silicon dioxide and/or silicon nitride) is between gate 22 and channel region 20. The example depicted components for brevity and clarity are only shown in FIG. 1 as a vertical cross-section. The example source/drain regions and channel regions may be, for example, in the form of coextensive longitudinally elongated lines running into and out of the plane of the page upon which FIG. 1 lies. Alternately and by way of example only, such may be circular, rectangular, elliptical, triangular, etc. in horizontal cross-section (not shown). Gate insulator 24 and/or gate 22 may peripherally encircle such structures or alternately, by way of example only, be only partially around such structures or only on one lateral-side in vertical cross-section (not shown). Top source/drain region 16 and channel region 20 may be considered as having a top interface 38 and bottom source/drain region 18 and channel region 20 may be considered as having a bottom interface 40, Interfaces 38 and/or 40 are shown as being flat and horizontal, although other oriented interfaces may be used, for example diagonal, a jagged and/or undulating interface, a combination of straight and curved segments, etc, By way of examples only, regions 16, 18, and 20 may comprise one or more of elemental-form silicon, elemental-form germanium, a mixture of silicon and germanium, etc.

Top source/drain region 16, bottom source/drain region 18, and channel region 20 respectively have crystal grains 30 and grain boundaries 32 between immediately-adjacent crystal grains 30. Ideally, such regions are each entirely crystalline. In this document, "crystalline" not immediately preceded by a numerical percentage or other quantifying adjective is a material, region, and/or structure that is at least 90% by volume crystalline (i.e., having at least 90% by volume crystal grains). Two or three of regions 16, 18, 20 may have the same or different average crystal grain size(s) (i.e., volumetric) relative one another. Regardless, in one embodiment, all of grain boundaries 32 that are between immediately-adjacent crystal grains 30 at one of interfaces 38 and 40 (at least one and both as shown) align relative one another. Alternately, in another embodiment, all of grain boundaries 32 that are between immediately-adjacent crystal grains 30 at one of interfaces 38 and 40 (at least one and including both) do not align relative one another (not shown).

At least one of bottom source/drain region 18 and channel region 20 (bottom source/drain region 48 as shown) has an internal interface 36 there-within (i.e., such interface being between and not comprising part of the respective top or bottom/base of such bottom source/drain region and/or channel region) between crystal grains 30 that are above internal interface 36 and crystal grains 30 that are below internal interface 36. At least some of crystal grains 30 that are immediately-above interface 36 physically contact at least some of crystal grains 30 that are immediately-below interface 36. In the context of this document as respects "immediately-above" and "immediately-below" and crystal grains, such means no other crystal grain is between the interface and said crystal grain that is immediately-above or immediately-below the interface. All of grain boundaries 32 that are between immediately-adjacent of the physically-contacting crystal grains 30 that are immediately-above and that are immediately-below interface 36 align relative one another. Internal interface 36 comprises at least one of (a) and (b) where: (a): conductivity-modifying dopant concentration immediately-above the interface is lower than immediately-below the interface, and (b): a laterally-discontinuous insulative oxide (e.g., silicon dioxide). In one embodiment, the conductivity-modifying dopant is immediately-above and immediately-below the interface, and the internal interface comprises both of (a) and (b). In one embodiment, at least one of the bottom source/drain region and the channel region is monocrystalline and in one such embodiment each of the bottom source/drain region and the channel region is monocrystalline. In one embodiment, at least one of the bottom source/drain region and the channel region is polycrystalline, and in one such embodiment each of the bottom source/drain region and the channel region is polycrystalline.

FIG. 1 shows an example embodiment wherein internal interface 36 is within bottom source/drain region 18, and comprising (a), wherein conductivity-modifying dopant is immediately-above and immediately-below interface 36. By way of example only, internal interface 36 is shown as being horizontal and half-way between a top and bottom/base of bottom source/drain region 18. Such may be otherwise oriented and/or positioned. FIG. 1 also shows an example embodiment wherein each of crystal grains 30 that is immediately-above interface 36 physically contacts one of crystal grains 30 that is immediately-below interface 36. Any other attribute(s) or aspect(s) as shown and/or described herein with respect to other embodiments may be used.

Figure 2:
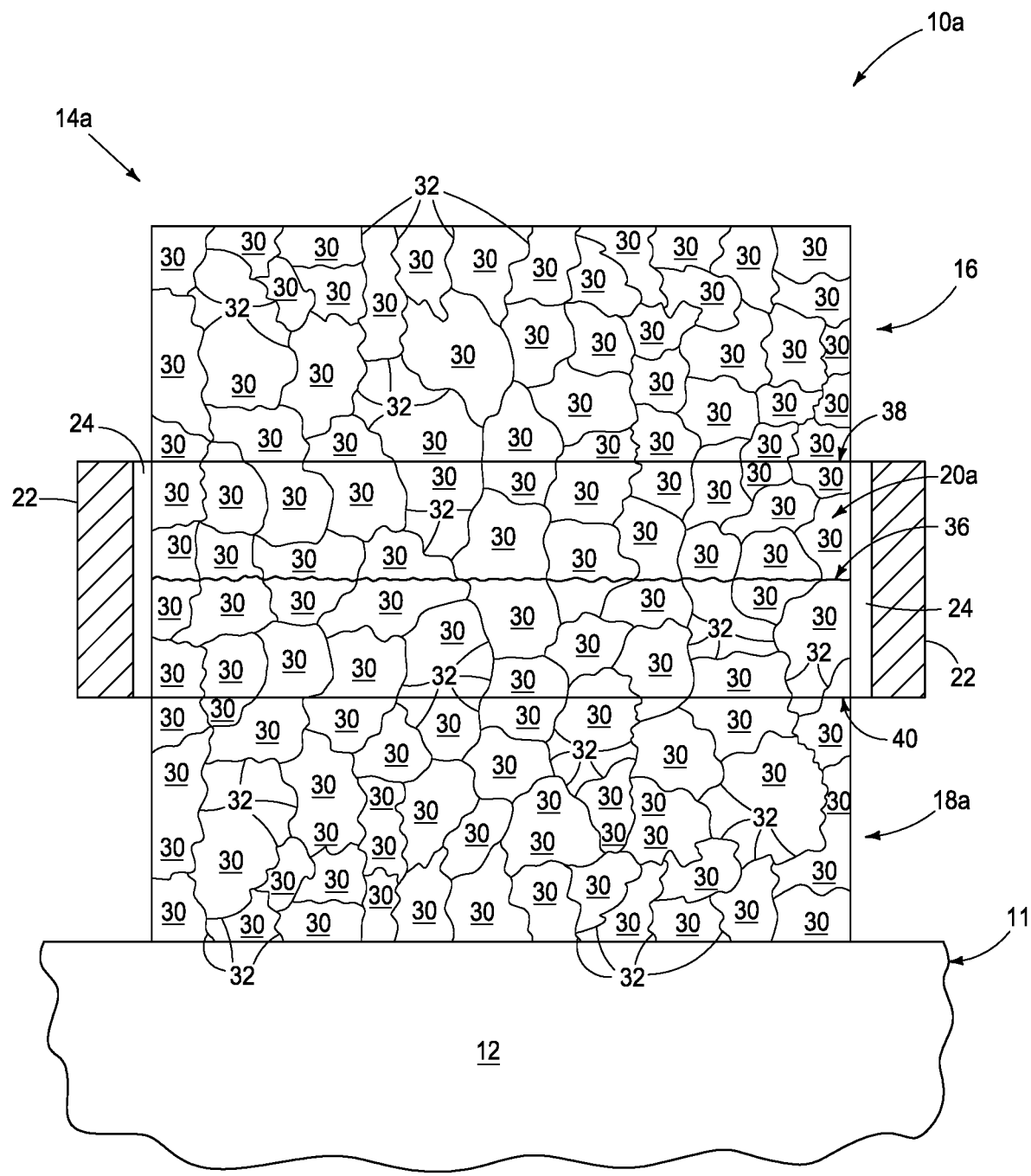
FIG. 2 is a diagrammatic sectional view of a transistor in accordance with an embodiment of the invention.
Figure 3:
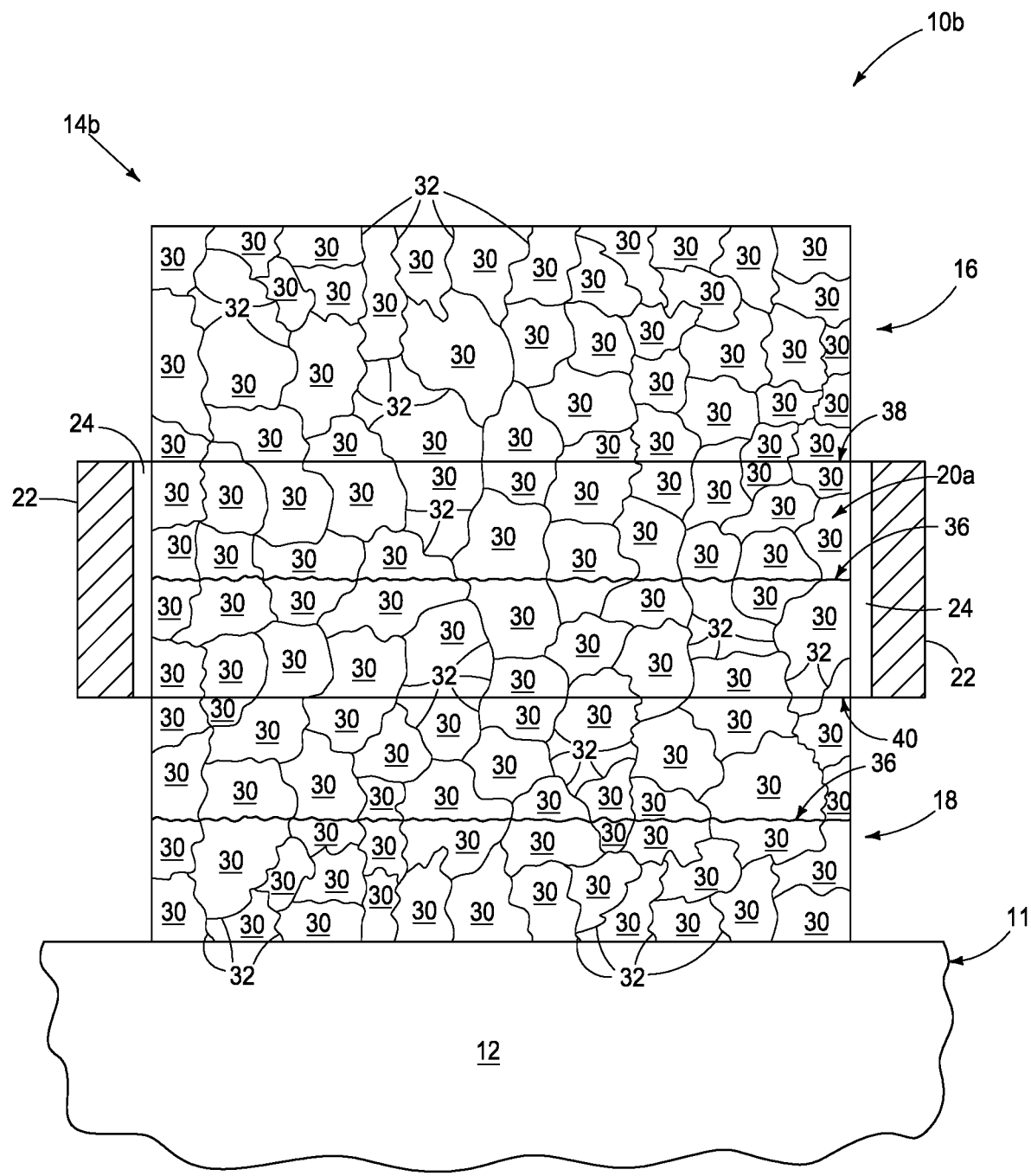
FIG. 3 is a diagrammatic sectional view of a transistor in accordance with an embodiment of the invention.

An alternate embodiment construction is shown in FIG. 2. Like numerals from the above-described embodiments have been used where appropriate, with some construction differences being indicated with the suffix "a". Construction 10a shows a transistor 14a wherein internal interface 36 is within channel region 20a. FIG. 3 shows an alternate example construction 10b comprising a transistor 14b wherein each of bottom source/drain region 18 and channel region 20a has such an internal interface 36. Like numerals from the above-described embodiments have been used where appropriate, with some construction differences being indicated with the suffix "b". Any other attribute(s) or aspect(s) as shown and/or described herein with respect to other embodiments may be used. Any other attribute(s) or aspect(s) as shown and/or described herein with respect to other embodiments may be used.

Figure 4:
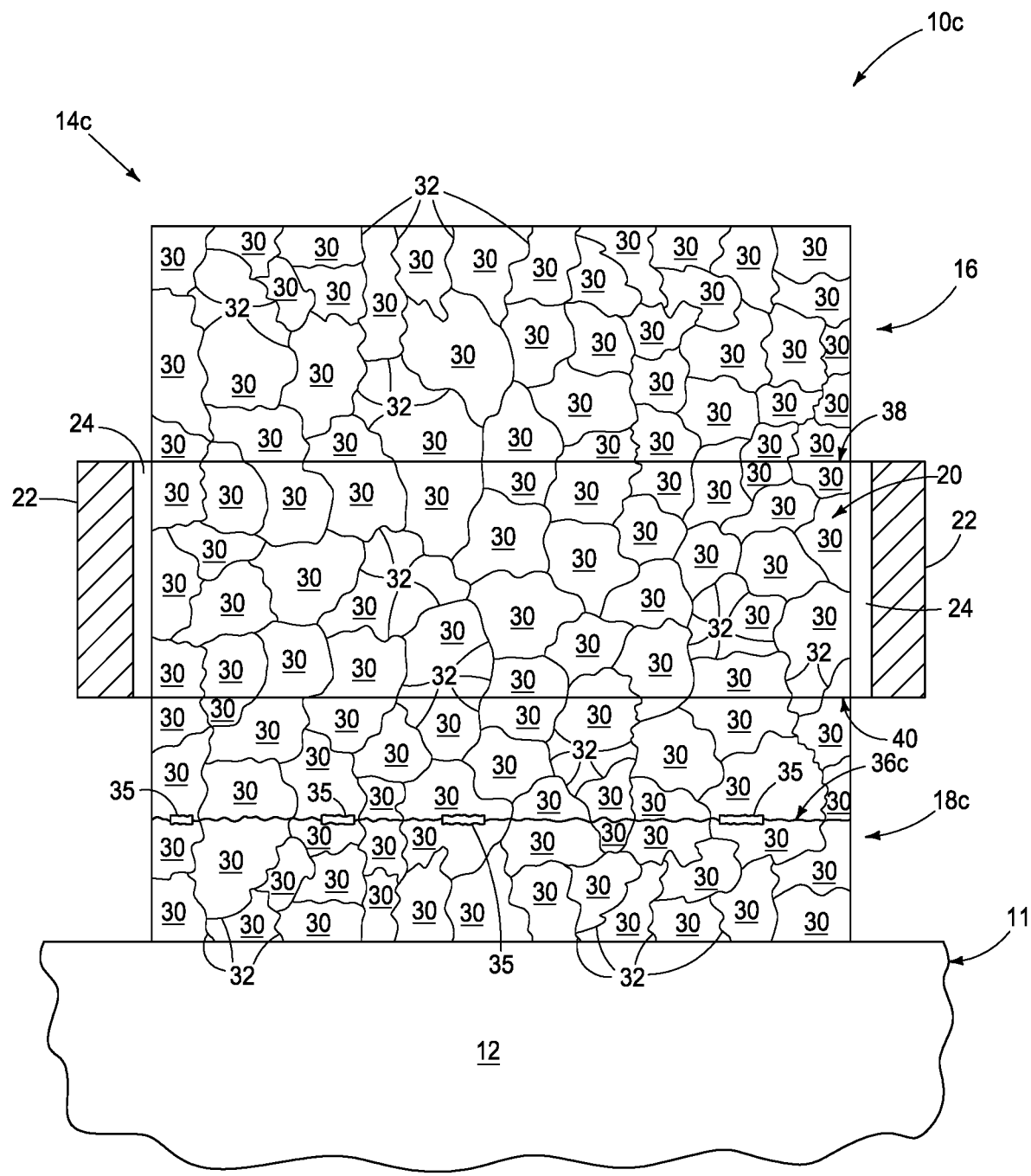
FIG. 4 is a diagrammatic sectional view of a transistor in accordance with an embodiment of the invention.

FIG. 4 shows another example construction 10c comprising a transistor 14c in accordance with an embodiment of the invention. Like numerals from the above-described embodiments have been used where appropriate, with some construction differences being indicated with the suffix "c" or with different numerals. Transistor 14c comprises (b): a laterally-discontinuous insulative oxide 35 comprising internal interface 36c. Interface 36c may be considered as any of tops, bottoms, or going laterally though laterally-discontinuous insulative oxide 35.

Figure 5:
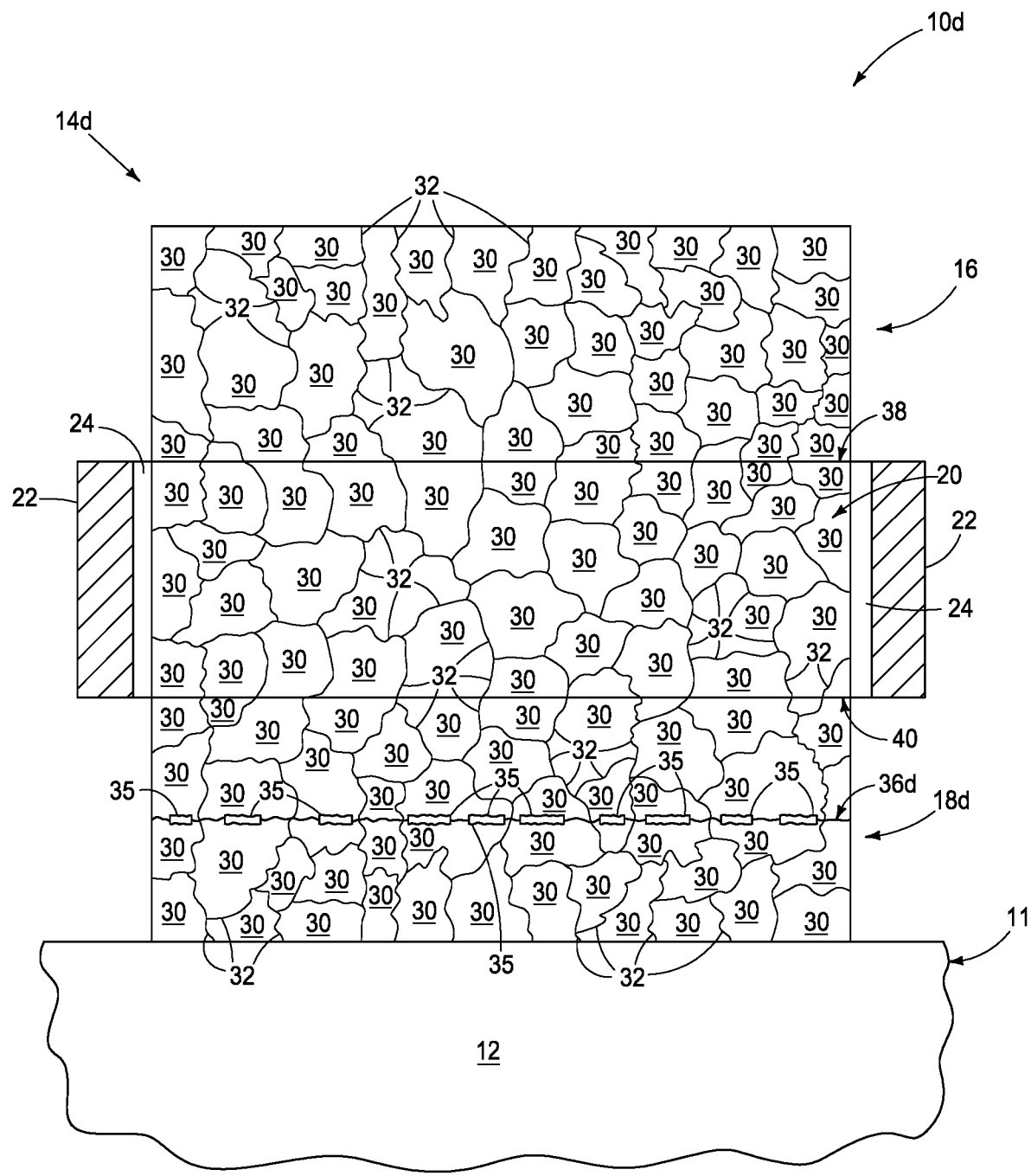
FIG. 5 is a diagrammatic sectional view of a transistor in accordance with an embodiment of the invention.

FIG. 4 shows an example embodiment wherein laterally-discontinuous insulative oxide 35 occupies less than a majority of interface 36c, and in one such embodiment as shown wherein laterally-discontinuous insulative oxide 35 occupies no more than 25% of such interface. FIG. 5 shows an alternate example embodiment construction 10d comprising a transistor $14_d$ wherein laterally-discontinuous insulative oxide 35 occupies a majority of interface 36d. Like numerals from the above-described embodiments have been used where appropriate, with some construction differences being indicated with the suffix "d". Any other attribute(s) or aspect(s) as shown and/or described herein with respect to other embodiments may be used.

Figure 6:
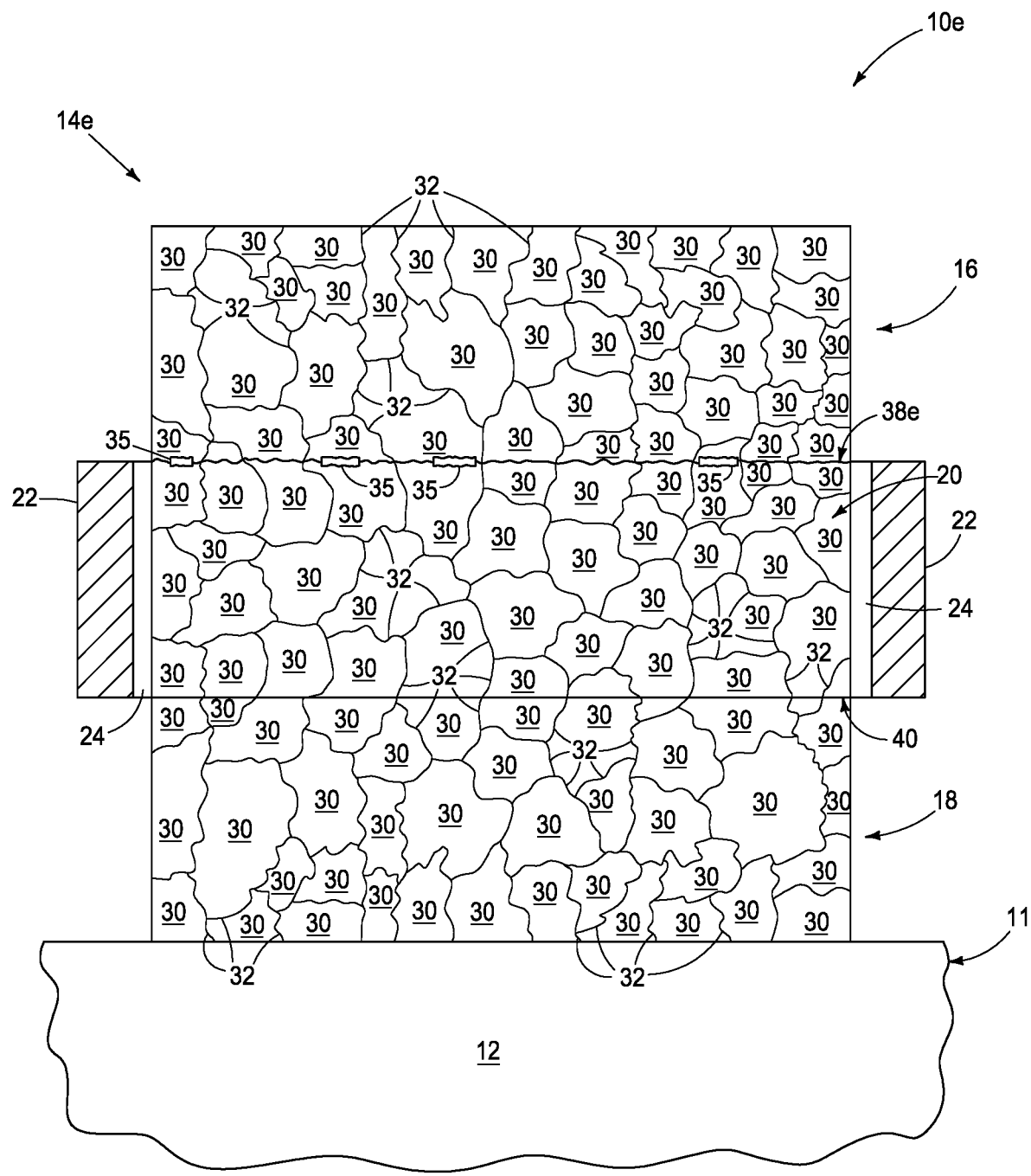
FIG. 6 is a diagrammatic sectional view of a transistor in accordance with an embodiment of the invention.
Figure 7:
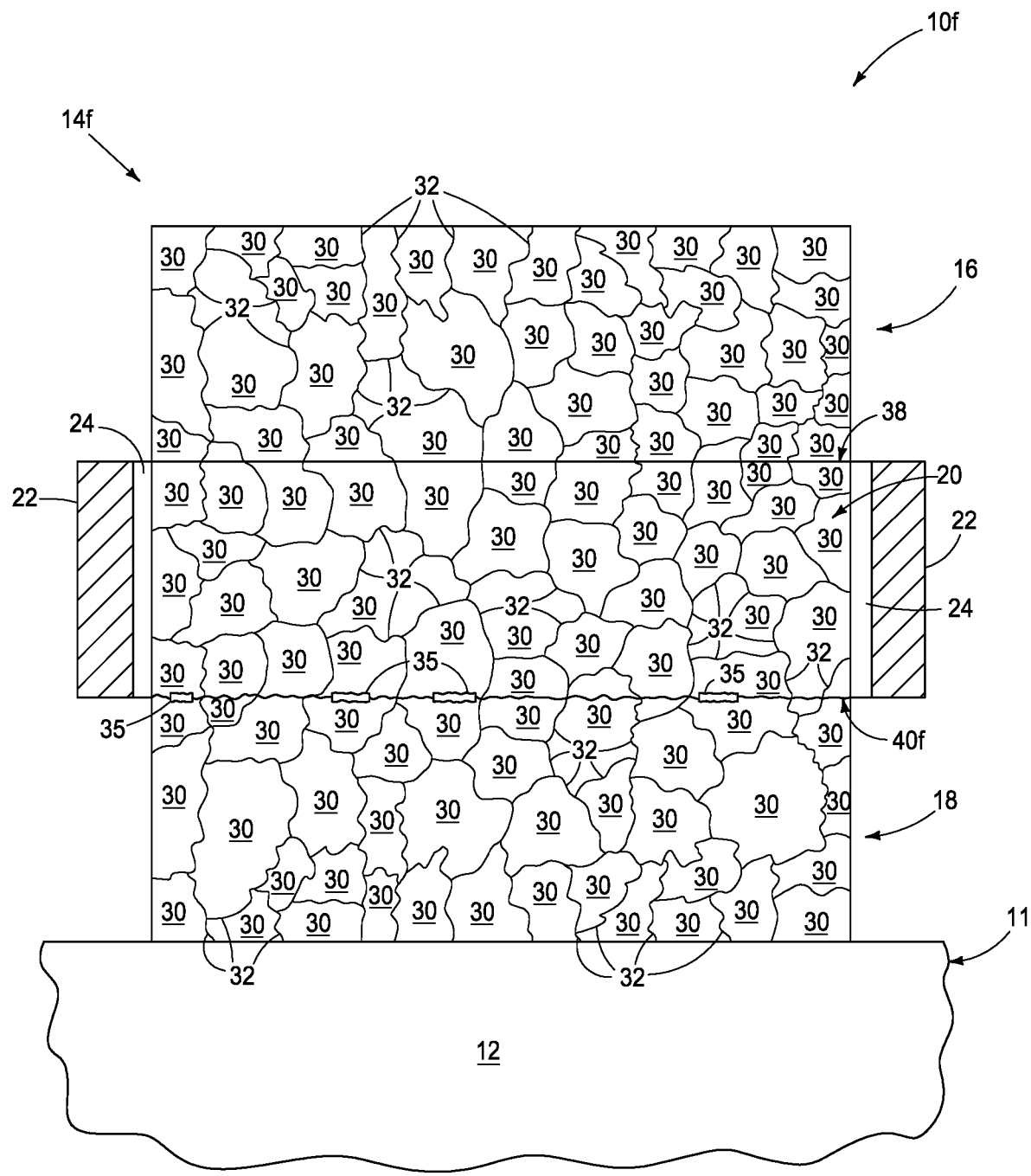
FIG. 7 is a diagrammatic sectional view of a transistor in accordance with an embodiment of the invention.
Figure 8:
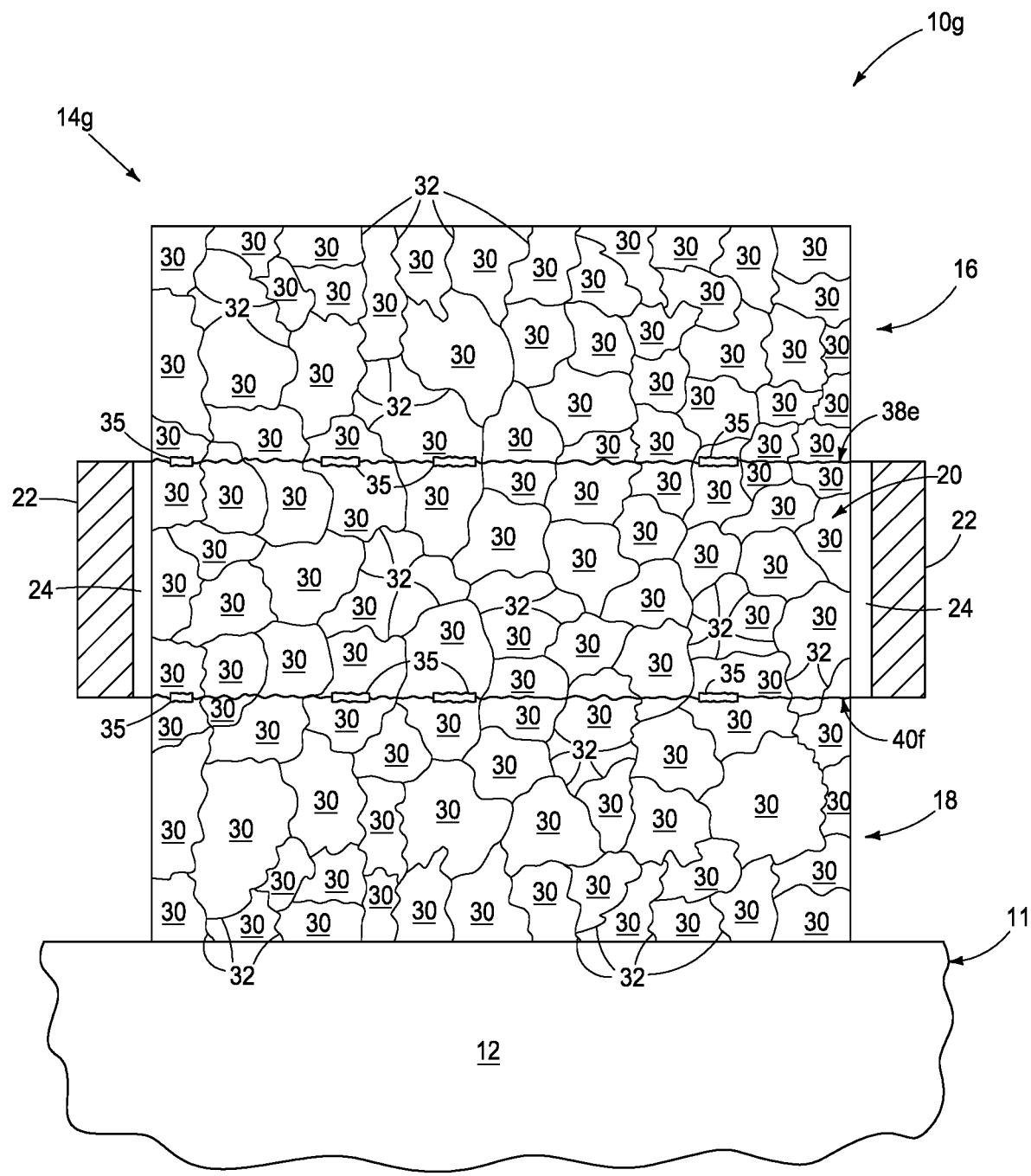
FIG. 8 is a diagrammatic sectional view of a transistor in accordance with an embodiment of the invention.

Another alternate embodiment construction 10e comprising a transistor 14e is shown in FIG. 6. Like numerals from the above-described embodiments have been used where appropriate, with some construction differences being indicated with the suffix "e". At least one of top interface 38 and bottom interface 40 (top interface 38 as shown) comprises a laterally-discontinuous insulative oxide 35. FIG. 7 shows an alternate embodiment construction 10f comprising a transistor 14f wherein bottom interface 40f comprises laterally-discontinuous insulative oxide 35, with FIG. 8 showing another alternate construction 10g comprising a transistor 14h wherein each of top interface 38 and bottom interface 40 comprise a laterally-discontinuous insulative oxide 35. Like numerals from the above-described embodiments have been used where appropriate, with some construction differences being indicated with the suffix's "f" and "g", respectively. In one embodiment wherein each of the top and bottom interfaces comprises the laterally-discontinuous insulative oxide, such are of the same composition relative one another and in another embodiment are of different compositions relative one another. An internal interface 36 (not shown) may be provided within at least one of bottom source/drain region 18 and channel region 20, for example as described above, and any other attribute(s) or aspect(s) as shown and/or described herein with respect to other embodiments may be used.

Any of the upper source/drain region, the bottom source/drain region, and/or the channel region vertically-therebetween may have a plurality of vertically-elongated crystal grains that individually are directly against both of their respective top or bottom and the immediately-adjacent source/drain region(s) or channel region (e.g., at any of interfaces 38, 38e, 40, 40f, and not shown). Alternately and/or additionally, if an internal interface is present, there may be a plurality of vertically-elongated crystal grains that individually are directly against such internal interface and the respective top or bottom of such source/drain region or channel region (not shown). Such may exist above, below, or both above and below such an internal interface.

Embodiments of the invention encompass a method of forming a transistor, for example any of the transistors described above and shown in the figures. An example such method is next described with references to FIGS. 9-12. Like numerals for predecessor constructions have been used where appropriate.

Figure 9:
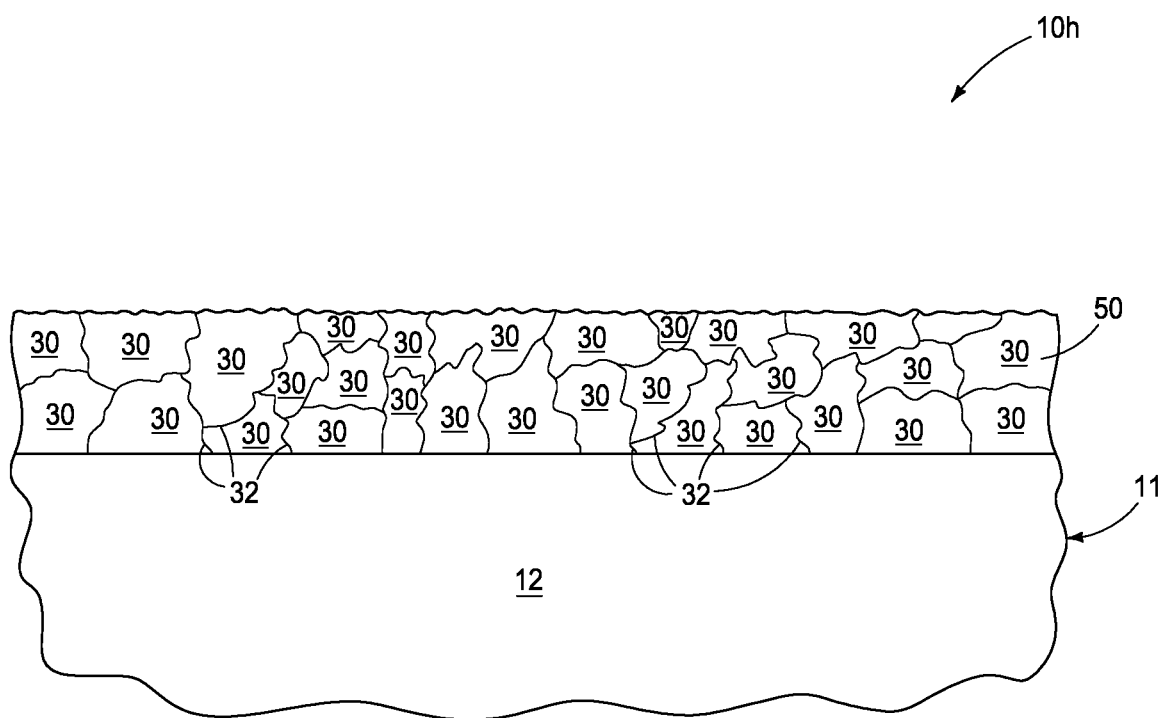
FIG. 9 is a diagrammatic cross-sectional view of a portion of a substrate construction in process in accordance with an embodiment of the invention.

Referring to FIG. 9, a bottom crystalline seed material 50 has been formed above substrate 11 as part of a construction 10h (which, for example, may be a predecessor to any of constructions 10, 10a, 10b, 10c, 10d, 10e, 10f, 10g). Bottom crystalline seed material 50 has bottom-material crystal grains 30 and bottom-material crystal grain boundaries 32 between immediately-adjacent bottom-material crystal grains 30. By way of examples only, bottom crystalline seed material 50 may be a layer that comprises that portion of bottom source/drain region 18, 18c, 18d that is below internal interface 36, 36c, 36d in FIGS. 1-5 above (e.g., alone or in combination with channel material). Alternately, and by way of examples only, bottom crystalline seed material 50 may comprise all of bottom source/drain region 18 below bottom interface 40 in any of the above-described embodiments. Regardless, ideally bottom crystalline seed material 50 is formed at low temperature (e.g., below 600° C. and ideally below 450° C.) using solid phase crystallography or solid phase epitaxy with or without laser-assisted crystallization, including any other existing or future developed method(s).

Figure 10:
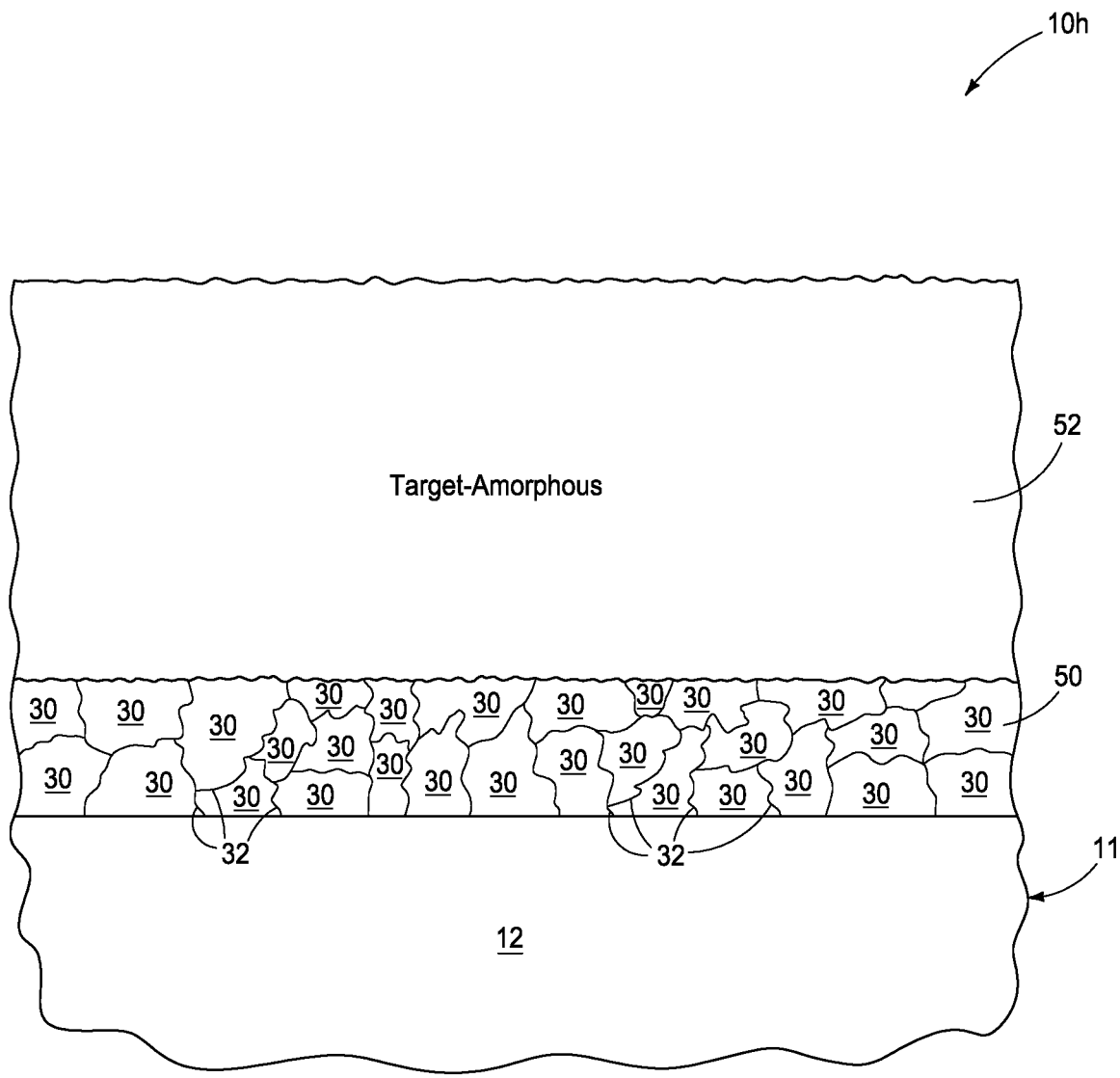
FIGS. 10-12 are diagrammatic sequential cross-sectional views of the construction of FIG. 9 in process in accordance with an embodiment of the invention.

Referring to FIG. 10, and in one embodiment, amorphous material 52 has been formed atop and directly against bottom crystalline seed material 50. In this document, a material, region, and/or structure is "amorphous" if such is at least 90% by volume amorphous. In some embodiments, material 52 may be considered as target material 52 and regardless of whether such material is amorphous, crystalline, or some combination thereof. Regardless, material 52 may be formed, for example, of a thickness of material of bottom source/drain region 18, 18c, 18d above internal interface 36, 36c, 36d up to bottom interface 40. Alternately, as examples, material 52 may be formed to a thickness which is greater than such portion of bottom source/drain region 18, 18c, 18d above internal interface 36, 36c, 36d to include part or all of thickness of channel region 20, 20a, and including upwardly to include some or all of the thickness of top source/drain region 16. Accordingly, and as will be apparent from the continuing discussion, material 52 may subsequently be transformed to comprise at least some part of a bottom source/drain region, a channel region, and/or an top source/drain region of a vertical transistor. Regardless, all or one or more portions of material 52 may be doped or undoped at this point in processing. In this document, "undoped" means from zero percent up to no greater than 0.1 molar percent of any and all conductivity-modifying dopant (e.g., phosphorus, arsenic, etc.), with "doped" meaning more than 0.1 molar percent of any and all conductivity-modifying dopant.

Figure 11:
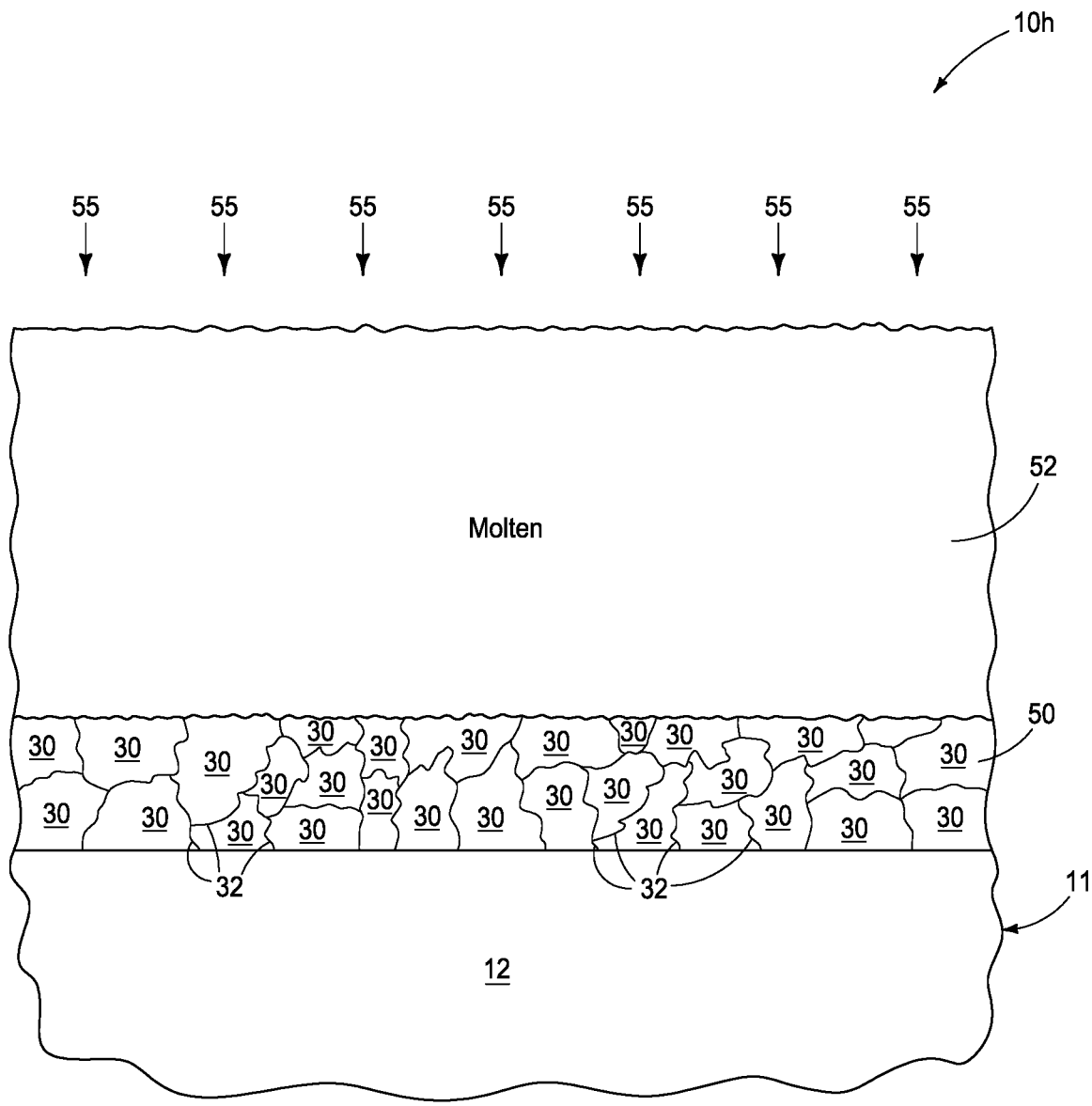

Referring to FIG. 11, material 52 has been laser annealed, (as indicated by example downwardly-directed arrows 55) to render material 52 molten. By way of examples only, laser annealing may use a wavelength between 200 and 700 nanometers, power at 0.1 to 2 J/cm$^2$ (ideally, 0.5 to 2 J/cm$^2$), pulse width 5 to 250 nanoseconds, number of laser shots 1 to 100, and substrate temperature from room temperature to 450° C. Laser power for all anneals herein can be varied as selected by the artisan to control surface roughness of interfaces and grain size of the layer(s) being laser annealed. Additionally, substrate temperature may be varied for different laser shots, as may laser power and/or pulse width. Molten material 52, regardless of amorphous vs. crystallinity before the laser annealing, will be amorphous the result of melting. In one embodiment, such laser annealing does not melt any of bottom crystalline seed material 50 therebelow. In an alternate embodiment, the laser annealing of material 52 melts an uppermost portion of bottom crystalline seed material 50 there-below. Any regions within material 52 immediately-prior to the laser annealing that may doped to different respective concentrations will have a tendency to diffuse such dopants throughout molten material 52, although not-necessarily to result in homogeneity with respect to dopant concentration in previously different concentration regions.

Figure 12:
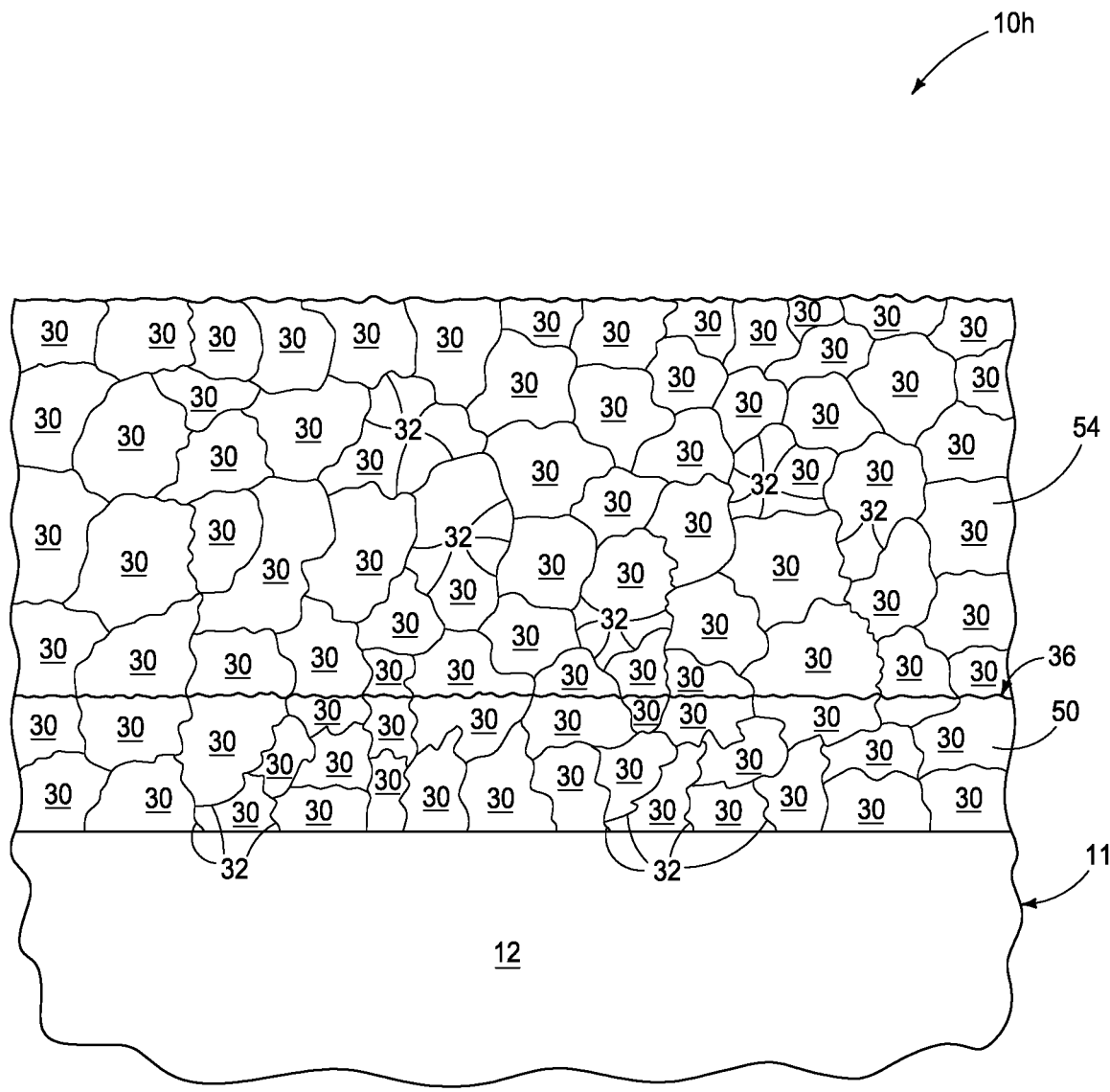

Referring to FIG. 12, formerly molten material 52 (not shown) has been cooled to form crystalline material 54, in some embodiments referred to as target crystalline material 54. At least a lower portion of material 54 can be considered as mid crystalline material that physically contacts and has crystallinity the same as that of bottom crystalline seed material 50. Accordingly, mid crystalline material 54 will have mid-material crystal grains 30 and mid-material grain boundaries 32 between immediately-adjacent mid-material crystal grains 30, Mid crystalline material 54 and bottom crystalline seed material 50 have an interface 36 (or 36c, 36d, 38e, or 40f, and not shown) there-between. At least some of mid-material crystal grains 30 that are immediately-above such interface physically contact at least some of bottom-material crystal grains 30 that are immediately-below such interface. All of mid-material grain boundaries 32 that are between immediately-adjacent mid-material crystal grains 30 that physically contact bottom-material crystal grains 30 that are immediately-below such interface align with all of bottom-material grain boundaries 32 that are between immediately-adjacent bottom-material crystal grains 32 that physically contact mid-material crystal grains 30 that are immediately-above such interface 36. The interface, again, comprises at least one of (a) and (b), where: (a): conductivity-modifying dopant concentration immediately-above the interface is lower than immediately-below the interface; and (b): a laterally-discontinuous insulative oxide.

In one embodiment, the interface is formed to be an internal interface that is within what is or will be bottom source/drain region 18, 18c, 18d. Alternately, the interface is formed to be an internal interface that is within channel region 20a. Alternately, the interface is formed to be one of interfaces 40, 40f, 38, or 38e. Any other attribute(s) or aspect(s) as shown and/or described herein with respect to other embodiments may be used.

The transistor being formed is ultimately formed to comprise a top source/drain region (e.g., 16), a bottom source/drain region (e.g., 18, 18a, 18c, 18d), and a channel region (e.g., 20, 20a) vertically between the top and bottom source/drain regions. At least a portion of the bottom crystalline seed material comprises at least a part of at least one of the top source/drain region, the bottom source/drain region, and the channel region. At least a portion of the mid crystalline material comprises at least a part of at least one of the top source/drain region, the bottom source/drain region, and the channel region. Regardless, a gate insulator (e.g., 24) and a gate (e.g., 22) are ultimately formed laterally-adjacent the channel region, for example to ultimately form any of constructions 10, 10a, 10b, 10c, 10d, 10e, 10f, 10g. Any other attribute(s) or aspect(s) as shown and/or described herein with respect to other embodiments may be used.

Figure 13:
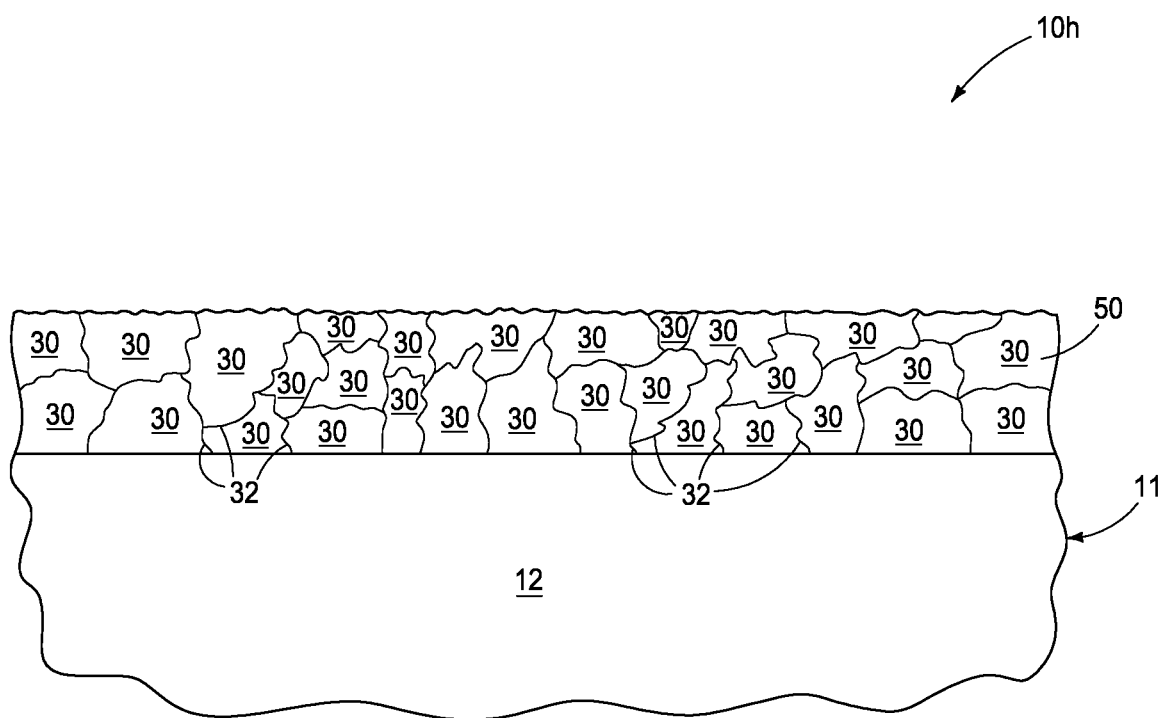
FIG. 13 is a diagrammatic cross-sectional view of a portion of a substrate construction in process in accordance with an embodiment of the invention.

An additional embodiment is next described with references to FIGS. 13-17. Like numerals from the above-described embodiments have been used where appropriate, with some construction differences being indicated with the suffix "k" or with different numerals. FIG. 13 shows the same processing as depicted by FIG. 9 wherein a crystalline seed material 50 has been formed, however which in this embodiment that comprises a lower crystalline seed material as another crystalline seed material will be formed immediately-above and there-from such that the bottom crystalline seed material comprises a composite of at least two time-spaced formed materials that may be of the same or different composition(s) relative one another as will be apparent from the continuing discussion.

Figure 14:
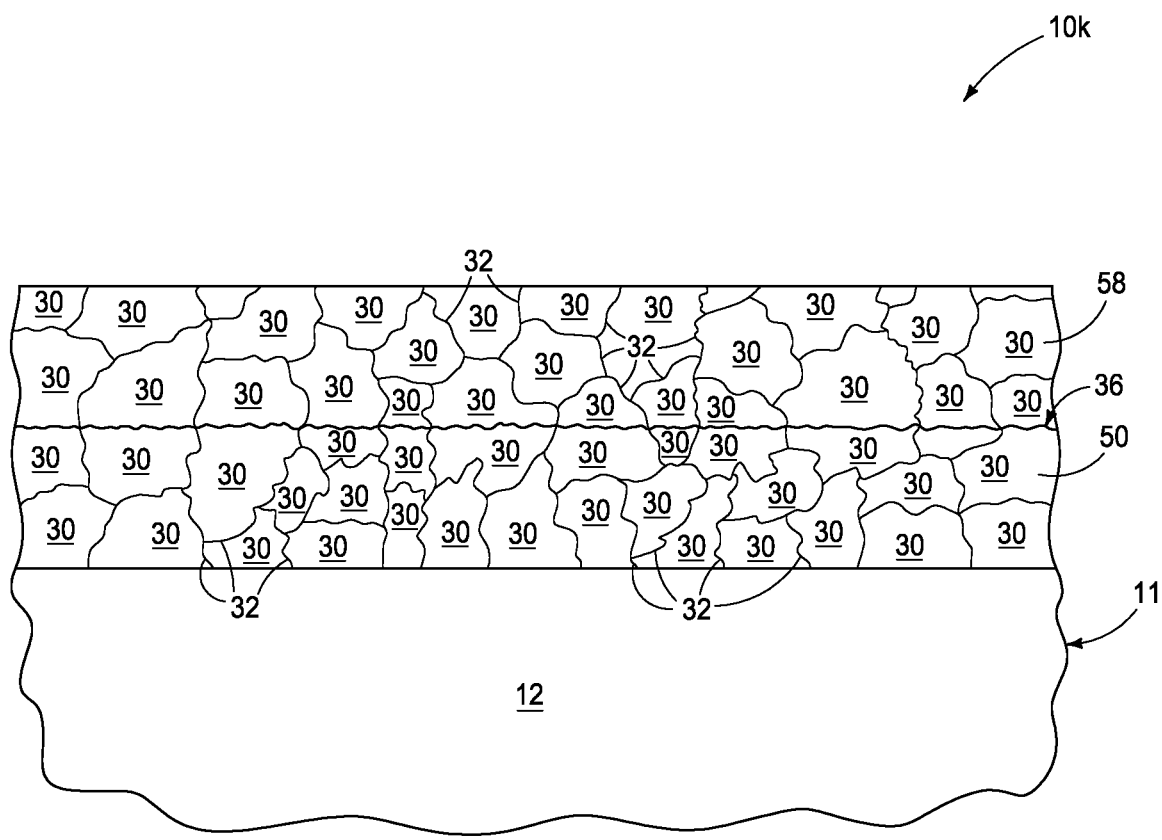
FIGS. 14-17 are diagrammatic sequential cross-sectional views of the construction of FIG. 13 in process in accordance with an embodiment of the invention.

Referring to FIG. 14, an upper crystalline seed material 58 has been epitaxially grown from lower crystalline seed material 50, forming an interface 36 (or 36c, 36d, 38e, or 40f, and not shown) there-between analogous to the processing described above with respect to FIG. 10. Material 58 may ultimately form an upper portion of bottom source/drain region 18, 18c, 18d; a lower portion or all of channel region 20, 20a; or at least an upper portion of upper crystalline seed material 58 may comprise at least a lower portion of top source/drain region 16. Regardless, upper crystalline seed material 58 may have all or portions thereof doped or undoped with conductivity modifying impurity at this point in processing. Further, ideally upper crystalline seed material 58 is formed at low temperature (e.g., below 600° C. and ideally below 450° C.) using solid phase crystallography or solid phase epitaxy with or without laser-assisted crystallization, including any other existing or future developed method(s).

Figure 15:
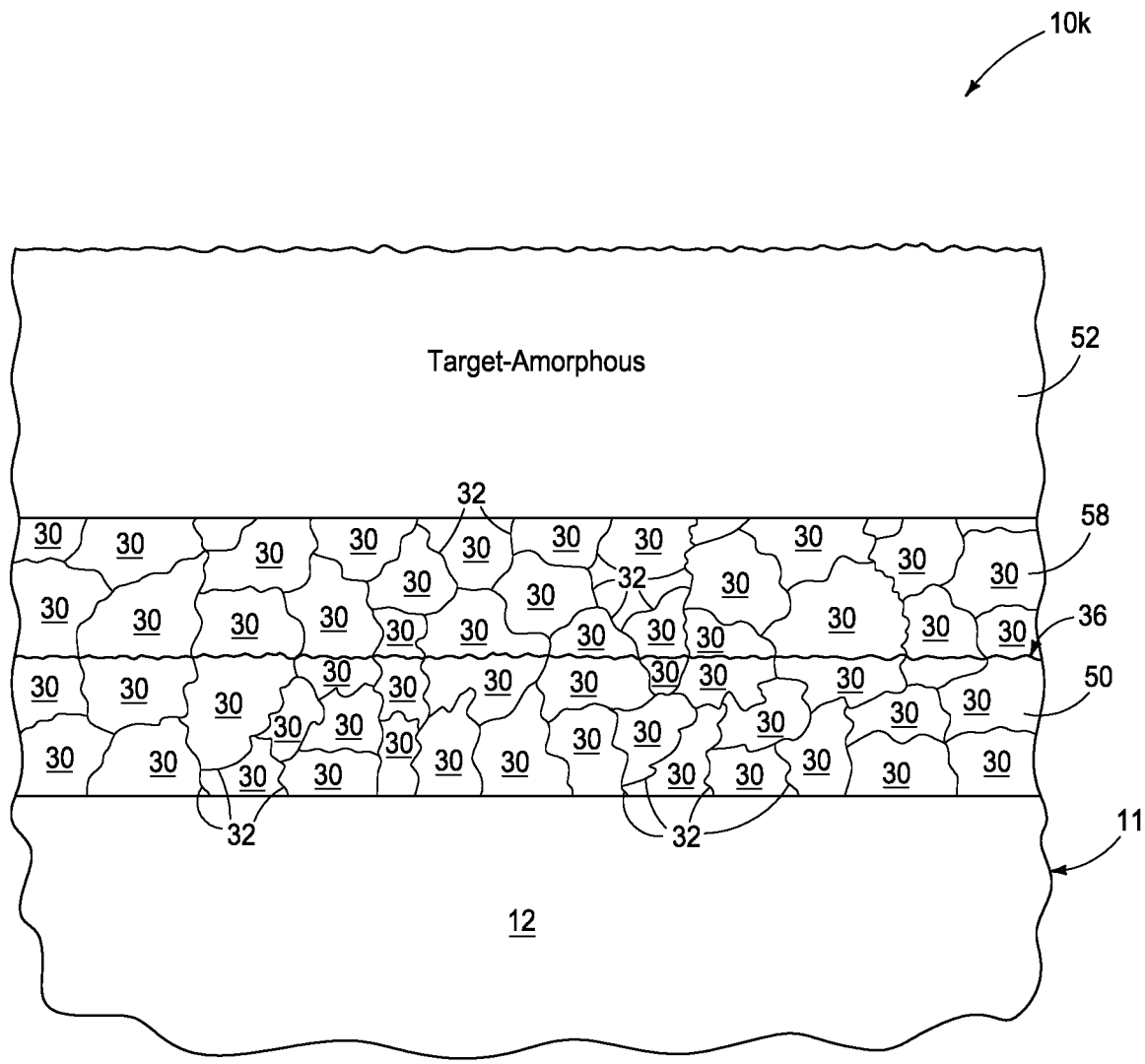

Referring to FIG. 15, amorphous and/or target material 52 has been formed atop and directly against epitaxially-grown upper crystalline seed material 58.

Figure 16:
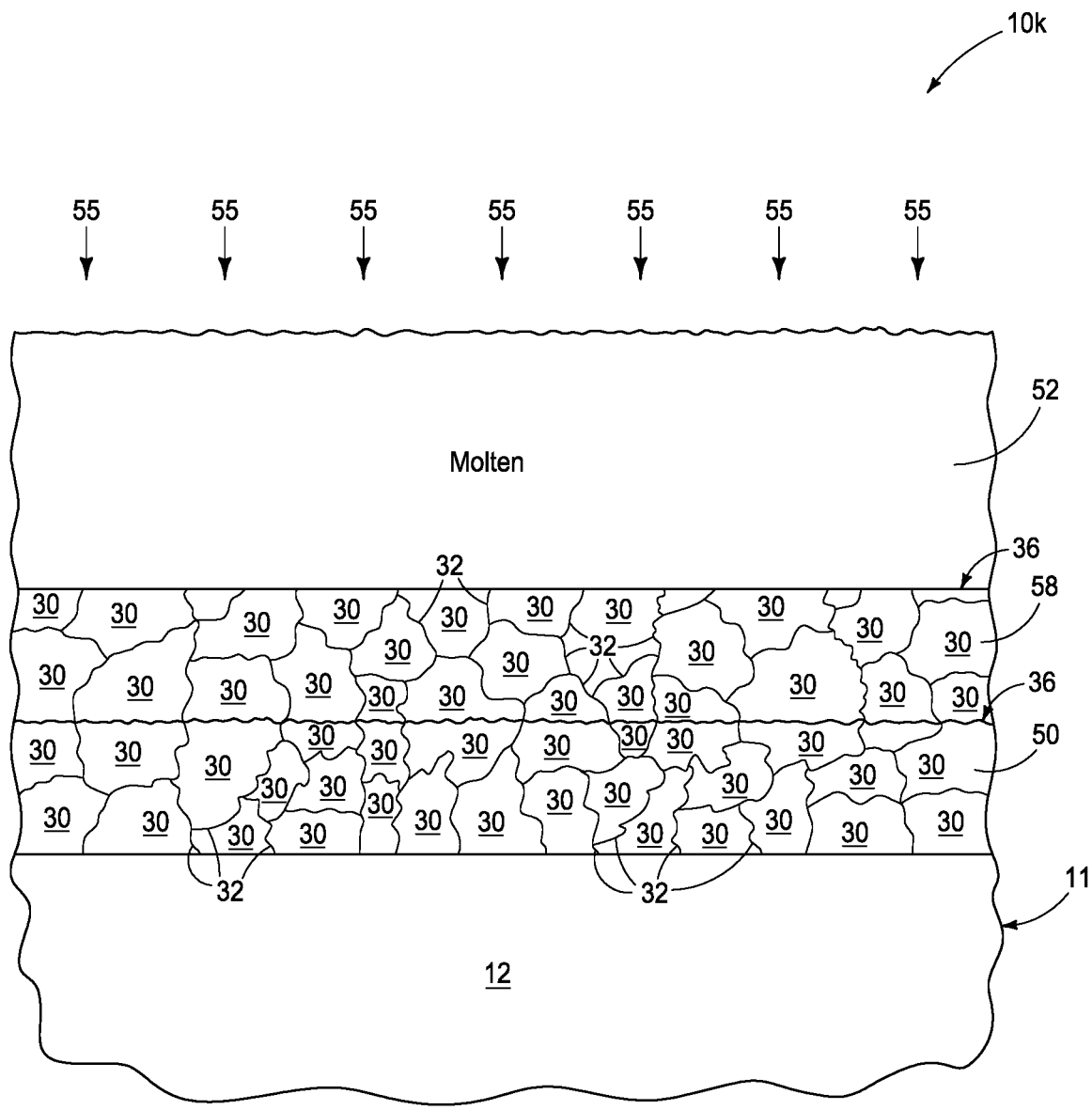
Figure 17:
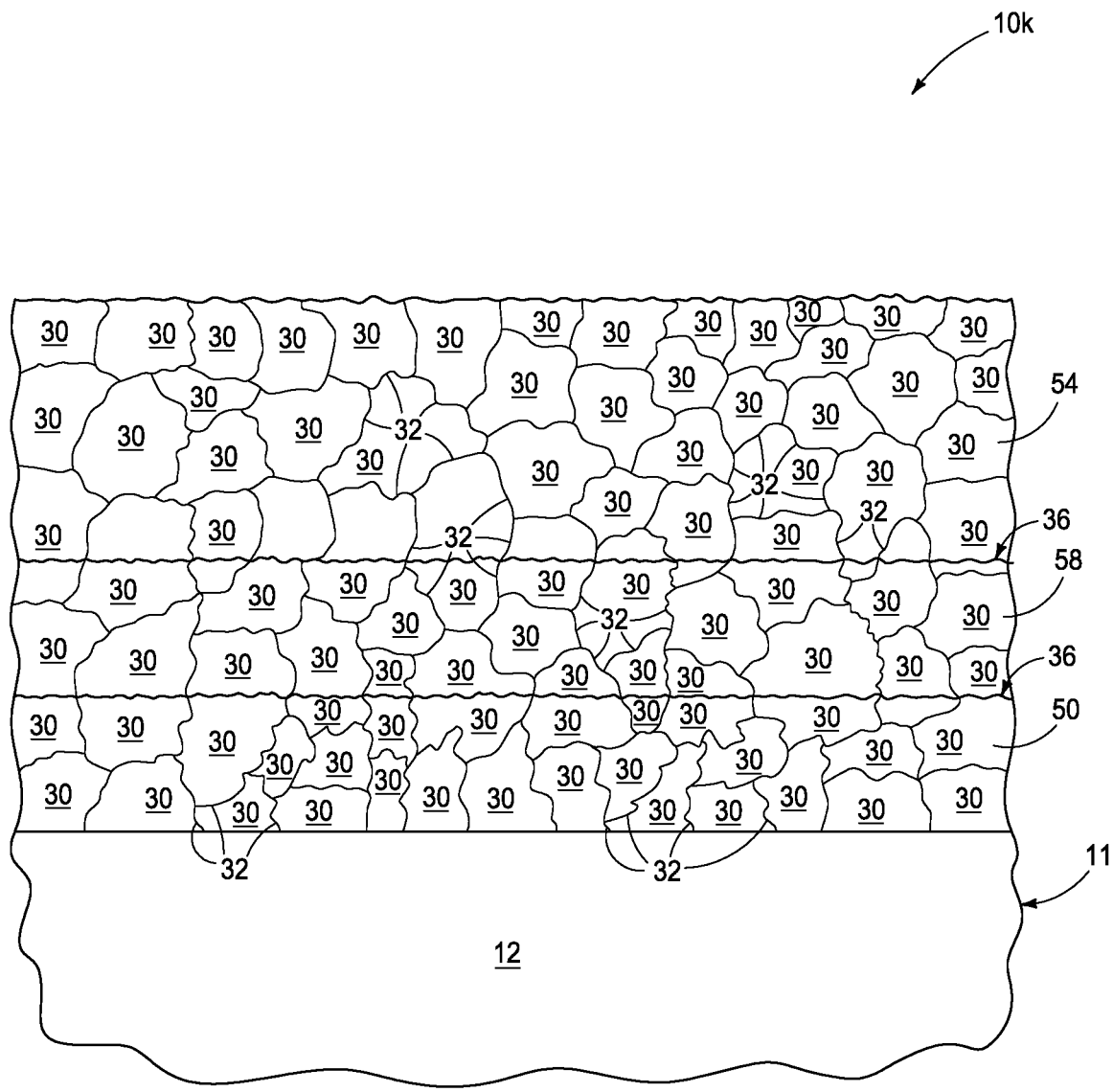

Referring to FIGS. 16 and 17, material 52 has been laser annealed and thereafter cooled to produce a construction as appearing in FIG. 17 (e.g., having another an interface 36 [or 36c, 36d, 38e, or 40f, and not shown]). In one embodiment, at least an upper portion of epitaxially-grown upper crystalline seed material 58 is formed to comprise the channel region. In one such embodiment, at least a lower portion of epitaxially-grown upper crystalline seed material 58 is formed to comprise the channel region and at least a lower portion of mid crystalline material 54 is formed to comprise the top source/drain region. In another such embodiment, a lower portion of epitaxially-grown upper crystalline seed material 58 is formed to comprise the bottom source/drain region. In one embodiment, a lower portion of mid crystalline material 54 is formed to comprise the channel region and an uppermost portion of mid crystalline material 54 is formed to comprise the top source/drain region. Any other attribute(s) or aspect(s) as shown and/or described herein with respect to other embodiments may be used.

Provision of an epitaxially-grown upper crystalline seed material 58 resulting in formation of interfaces 36 (and/or 36c, 36d, 38e, or 40f, and not shown) may result in such being an effective diffusion barrier between materials 58 and 50 to preclude unwanted diffusion of conductivity modifying dopant among the depicted three example regions. Regardless, subsequent diffusion doping or ion implantation may be conducted with respect to any of the above-described embodiments. Any other attribute(s) or aspect(s) as shown and/or described herein with respect to other embodiments may be used.

An embodiment of the invention comprises a method used in forming at least a portion of a vertical transistor (e.g., 14, 14a, 14b, 14c, 14d, 14e, 14f, 14g), with the portion comprising at least part of a top source/drain region (e.g., 16), at least part of a bottom source/drain region (e.g., 18, 18a, 18c, 18d), or at least part of a channel region (e.g., 20, 20a) vertically between the top and bottom source/drain regions. Such a method comprises forming a bottom crystalline seed material (e.g., 50 alone or a combination of 50 and 58), for example above a substrate (e.g., 11). A target material (e.g., 52) is formed atop and directly against the bottom crystalline seed material. Laser annealing is conducted of the target material to render it molten. In one embodiment, the target material is amorphous at start of the laser annealing and in another embodiment is crystalline at start of the laser annealing. In one embodiment, the bottom crystalline seed material and the target material are of the same chemical composition at start of the laser annealing, and in one such embodiment such chemical composition comprises silicon and which in one such embodiment is elemental-form silicon. The bottom crystalline seed material is used as a template while cooling the molten target material to epitaxially form target crystalline material physically contacting and having crystallinity the same as that of the bottom crystalline seed material. Any other attribute(s) or aspect(s) as shown and/or described herein with respect to other embodiments may be used.

Figure 18:
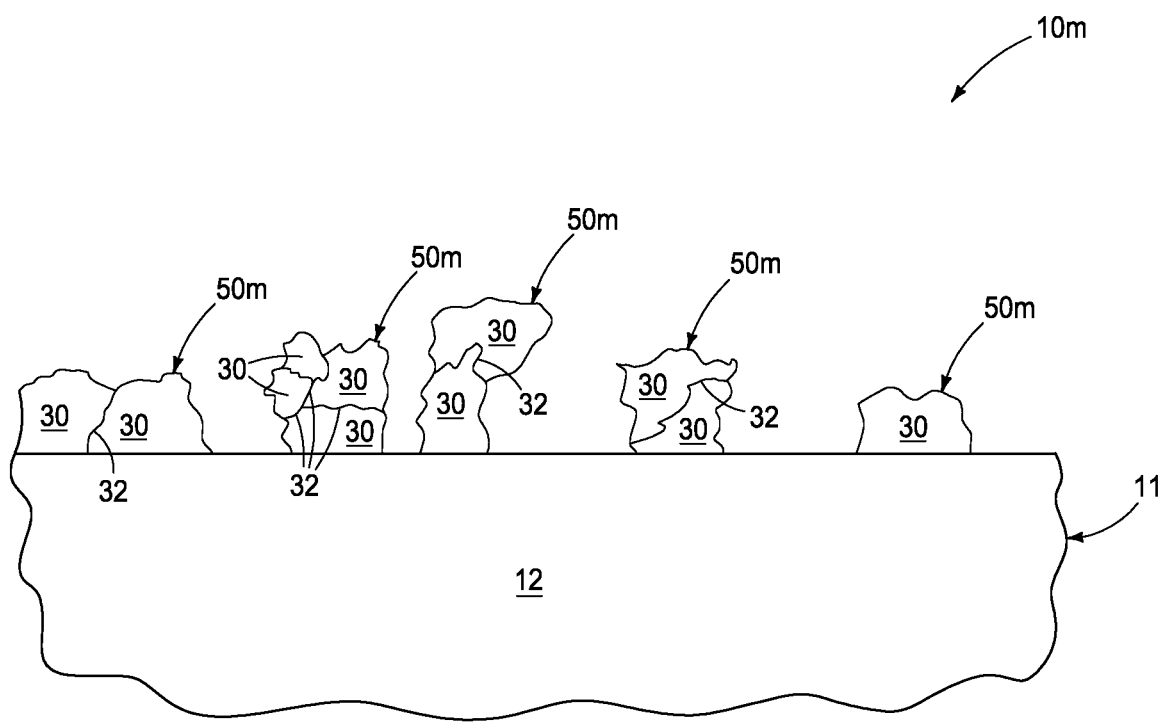
FIG. 18 is a diagrammatic cross-sectional view of a portion of a substrate construction in process in accordance with an embodiment of the invention.

The above-shown method embodiments of FIGS. 9-17 illustrate an example bottom seed material 50 or 50/58 as being formed as a laterally-continuous layer over substrate 11. Alternately, the bottom seed material might be formed as a laterally-discontinuous layer. For example, FIG. 18 shows an alternate example embodiment construction 10m corresponding to that of FIG. 9 but where bottom seed material 50m is laterally-discontinuous. Like numerals from the above-described embodiments have been used where appropriate, with some construction differences being indicated with the suffix "m". Such may provide some (or more of some) grain boundaries 32 of individual crystal grains 30 that are diagonally-oriented and/or laterally-oriented at outermost surfaces of the bottom seed material than otherwise occurs when an outermost surface thereof is laterally-continuous. This may advantageously provide additional diagonal-like and/or lateral crystalline propagation that may accelerate total crystalline propagation from seed material

50 or 50/58. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath.", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) devotionally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/material s/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition." only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a transistor comprises a top source/drain region, a bottom source/drain region, and a channel region vertically between the top and bottom source/drain regions. A gate is operatively laterally-adjacent the channel region. The top source/drain region, the bottom source/drain region, and the channel region respectively have crystal grains and grain boundaries between immediately-adjacent of the crystal grains. At least one of the bottom source/drain region and the channel region has an internal interface there-within between the crystal grains that are above the internal interface and the crystal grains that are below the internal interface. At least some of the crystal grains that are immediately-above the internal interface physically contact at least some of the crystal grains that are immediately-below the internal interface. All of the grain boundaries that are between immediately-adjacent of the physically-contacting crystal grains that are immediately-above and that are immediately-below the interface align relative one another. The internal interface comprises at least one of (a) and (b), where (a): conductivity-modifying dopant concentration immediately-above the internal interface is lower than immediately-below the internal interface and (b): a laterally-discontinuous insulative oxide.

In some embodiments, a transistor comprises a top source/drain region, a bottom source/drain region, and a channel region vertically between the top and bottom source/drain regions. A gate is operatively laterally-adjacent the channel region. The top source/drain region, the bottom source/drain region, and the channel region respectively have crystal grains and grain boundaries between immediately-adjacent of the crystal grains. The top source/drain region and the channel region have a top interface and the bottom source/drain region and the channel region have a bottom interface. At least one of the top interface and the bottom interface comprise a laterally-discontinuous insulative oxide.

In some embodiments, a method is used in forming at least a portion of a vertical transistor, where the portion comprises at least part of a top source/drain region, at least part of a bottom source/drain region, or at least part of a channel region vertically between the top and bottom source/drain regions. The method comprises forming a bottom crystalline seed material. Target material is formed atop and directly against the bottom crystalline seed material. The target material is laser annealed to render it molten. The bottom crystalline seed material is used as a template while cooling the molten target material to epitaxially form target crystalline material that physically contacts and has crystallinity the same as that of the bottom crystalline seed material.

In some embodiments, a method of forming a transistor comprises forming a bottom crystalline seed material. The bottom crystalline seed material has bottom-material crystal grains and bottom-material grain boundaries between immediately-adjacent of the bottom-material crystal grain. Amorphous material is formed atop and directly against the bottom crystalline seed material. The amorphous material is laser annealed to render it molten. The molten amorphous material is cooled to form mid crystalline material that physically contacts and has crystallinity the same as that as the bottom crystalline seed material. The mid crystalline material has mid-material crystal grains and mid-material grain boundaries between immediately-adjacent of the mid-material crystal grains. The mid crystalline material and the bottom crystalline seed material have an interface therebetween, At least some of the mid-material crystal grains that are immediately-above the interface physically contact at least some of the bottom-material crystal grains that are immediately-below the interface. All of the mid-material grain boundaries that are between immediately-adjacent of the mid-material crystal grains that physically contact the bottom-material crystal grains that are immediately-below the interface align with all of the bottom-material grain boundaries that are between immediately-adjacent of the bottom-material crystal grains that physically contact the mid-material crystal grains that are immediately-above the interface. The interface comprises at least one of (a) and (b), where (a): conductivity-modifying dopant concentration immediately-above the interface is lower than immediately-below the interface and (b): a laterally-discontinuous insulative oxide. The transistor is formed to comprise a top source/drain region, a bottom source/drain region, and a channel region vertically between the top and bottom source/drain regions. At least a portion of the bottom crystalline seed material comprises at least a part of at least one of the top source/drain region, the bottom source/drain region, and the channel region. At least a portion of the mid crystalline material comprises at least a part of at least one of the top source/drain region, the bottom source/drain region, and the channel region. A gate insulator and a gate are formed laterally-adjacent the channel region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming at least a portion of a vertical transistor, the portion comprising at least part of a top source/drain region, at least part of a bottom source/drain region, or at least part of a channel region vertically between the top and bottom source/drain regions, comprising:
   forming a bottom crystalline seed material;
   forming target material atop and directly against the bottom crystalline seed material;

laser annealing the target material to render it molten; and using the bottom crystalline seed material as a template while cooling the molten target material to epitaxially form target crystalline material physically contacting and having crystallinity the same as that of the bottom crystalline seed material.

2. The method of claim 1 wherein the target material is amorphous at start of the laser annealing.

3. The method of claim 1 wherein the target material is crystalline at start of the laser annealing.

4. The method of claim 1 wherein the bottom crystalline seed material and the target material are of the same chemical composition at start of the laser annealing.

5. The method of claim 4 wherein the chemical composition comprises silicon.

6. The method of claim 4 wherein the chemical composition comprises elemental-form silicon.

7. The method of claim 1 wherein the bottom crystalline seed material is laterally-continuous.

8. The method of claim 1 wherein the bottom crystalline seed material is laterally-continuous.

9. A method of forming a transistor, comprising:

forming a bottom crystalline seed material, the bottom crystalline seed material having bottom-material crystal grains and bottom-material grain boundaries between immediately-adjacent of the bottom-material crystal grains;

forming amorphous material atop and directly against the bottom crystalline seed material;

laser annealing the amorphous material to render it molten;

cooling the molten amorphous material to form mid crystalline material physically contacting and having crystallinity the same as that of the bottom crystalline seed material, the mid crystalline material having mid-material crystal grains and mid-material grain boundaries between immediately-adjacent of the mid-material crystal grains, the mid crystalline material and the bottom crystalline seed material having an interface there-between, at least some of the mid-material crystal grains that are immediately-above the interface physically contacting at least some of the bottom-material crystal grains that are immediately-below the interface, all of the mid-material grain boundaries that are between immediately-adjacent of the mid-material crystal grains that physically contact the bottom-material crystal grains that are immediately-below the interface aligning with all of the bottom-material grain boundaries that are between immediately-adjacent of the bottom-material crystal grains that physically contact the mid-material crystal grains that are immediately-above the interface, the interface comprising at least one of (a) and (b), where:

(a): conductivity-modifying dopant concentration immediately-above the interface is lower than immediately-below the interface; and (b): a laterally-discontinuous insulative oxide;

forming the transistor to comprise a top source/drain region, a bottom source/drain region, and a channel region vertically between the top and bottom source/drain regions; at least a portion of the bottom crystalline seed material comprising at least a part of at least one of the top source/drain region, the bottom source/drain region, and the channel region; at least a portion of the mid crystalline material comprising at least a part of at least one of the top source/drain region, the bottom source/drain region, and the channel region; and forming a gate insulator and a gate laterally-adjacent the channel region.

10. The method of claim 9 wherein the laser annealing of the amorphous material does not melt any of the bottom crystalline seed material there-below.

11. The method of claim 9 wherein the laser annealing of the amorphous material melts an uppermost portion of the bottom crystalline seed material there-below.

12. The method of claim 9 the bottom crystalline seed material is formed as a laterally-continuous layer.

13. The method of claim 9 the bottom crystalline seed material is formed as a laterally-discontinuous layer.

14. The method of claim 9 comprising forming the interface to be an internal interface that is within the bottom source/drain region.

15. The method of claim 9 comprising forming the interface to be an internal interface that is within the channel region.

16. The method of claim 9 comprising forming the interface to be an interface between the channel region and one of the top and bottom source/drain regions.

17. The method of claim 9 wherein the amorphous material is undoped during the laser annealing.

18. The method of claim 9 wherein the amorphous material is doped at least immediately-prior to the laser annealing.

19. The method of claim 9 wherein forming the bottom crystalline seed material comprises:

forming a lower crystalline seed material; and epitaxially growing an upper crystalline seed material from the lower crystalline seed material, the amorphous material being formed atop and directly against the epitaxially-grown upper crystalline seed material.

20. The method of claim 19 comprising forming at least an upper portion of the epitaxially-grown upper crystalline seed material to comprise the channel region.

21. The method of claim 20 comprising forming at least a lower portion of the epitaxially-grown upper crystalline seed material to comprise the channel region and forming at least a lower portion of the mid crystalline material to comprise the top source/drain region.

22. The method of claim 20 comprising forming a lower portion of the epitaxially-grown upper crystalline seed material to comprise the bottom source/drain region.

23. The method of claim 19 comprising forming a lower portion of the mid crystalline material to comprise the channel region and forming an uppermost portion of the mid crystalline material to comprise the top source/drain region.

24. The method of claim 19 wherein the epitaxially-grown upper crystalline seed material is undoped at least as initially grown.

25. The method of claim 19 wherein the conductivity-modifying dopant is immediately-above and immediately-below the interface, and comprising (a).

26. The method of claim 19 comprising (b).

* * * * *